United States Patent [19]
Camilletti et al.

[11] Patent Number: 5,780,163
[45] Date of Patent: Jul. 14, 1998

[54] MULTILAYER COATING FOR MICROELECTRONIC DEVICES

[75] Inventors: Robert Charles Camilletti; Loren Andrew Haluska; Keith Winton Michael, all of Midland, Mich.

[73] Assignee: Dow Corning Corporation, Midland, Mich.

[21] Appl. No.: 660,344

[22] Filed: Jun. 5, 1996

[51] Int. Cl.$^6$ .................. B32B 9/04; B32B 9/06
[52] U.S. Cl. .................. 428/446; 427/227; 427/228; 427/255; 427/261; 427/376.2; 427/376.3; 428/448; 428/450; 428/457
[58] Field of Search .............. 427/58, 227, 228, 427/326.2, 387, 392.7, 255, 376.3, 261; 428/688, 698, 702, 704, 457, 446, 448, 450

[56] References Cited

U.S. PATENT DOCUMENTS

| | | | |
|---|---|---|---|
| 3,615,272 | 10/1971 | Collins | 23/366 |
| 4,973,526 | 11/1990 | Haluska | 427/58 X |
| 4,999,397 | 3/1991 | Weiss | 524/755 |
| 5,010,159 | 4/1991 | Bank | 528/23 |
| 5,011,706 | 4/1991 | Tarhay | 427/39 |
| 5,145,723 | 9/1992 | Ballance | 427/397 |
| 5,380,567 | 1/1995 | Haluska | 427/227 X |
| 5,399,441 | 3/1995 | Bearinger | 428/689 |
| 5,458,912 | 10/1995 | Camilletti | 427/126 |

FOREIGN PATENT DOCUMENTS

| | | |
|---|---|---|
| 86017 | 5/1985 | Japan . |
| 107122 | 5/1988 | Japan . |
| 178749 | 7/1990 | Japan . |

*Primary Examiner*—Michael Lusignan
*Attorney, Agent, or Firm*—James L. DeCesare; Sharon K. Severance

[57] ABSTRACT

A method of forming a protective covering on an electronic or microelectronic device to prevent inspection. A first silica-containing ceramic layer is applied to the surface of the device to planarize its surface. A second silicon carbide coating layer is applied to the surface of the first silica-containing ceramic layer to form a hermetic barrier. A third porous silica-containing ceramic layer is formed on the surface of the second silicon carbide coating layer. The third porous silica-containing ceramic layer is impregnated with an opaque material or filler. A fourth metal layer or metal pattern is applied over the third opaque porous silica-containing ceramic layer. The fourth metal layer or pattern is then coated with a fifth layer similar to the third opaque porous silica-containing ceramic layer.

34 Claims, No Drawings

MULTILAYER COATING FOR MICROELECTRONIC DEVICES

CROSS-REFERENCE TO RELATED APPLICATIONS

This application is an improvement in multilayer coatings described in our prior copending application U.S. Ser. No. 08/563,255, filed Nov. 27, 1995, entitled "Protective Electronic Coating". The prior application is assigned to the same assignee as the present invention.

BACKGROUND OF THE INVENTION

This invention is directed to a series of five coatings used on electronic or microelectronic devices for hermetic protection, and to inhibit examination and/or reverse engineering of underlying electronic or microelectronic devices.

In our prior application Ser. No. 08/563,255, we describe certain three layer coatings for protecting microelectronic devices against destructive and non-destructive analysis. However, because of the rising incidence of examination and dissection of microelectronic devices by domestic and foreign commercial competitors including foreign governments, to determine their structure, the need exists for improvements in preventive measures to inhibit these types of competitive intrusions.

Our invention resides in a multilayer coating (i.e., five distinct layers) which can be used for hermetic protection, and which is adapted to provide improved protection to electronic devices against such inspections.

BRIEF SUMMARY OF THE INVENTION

The present invention relates to a method for forming a protective coating on an electronic device. The method comprises first applying a hydrogen silsesquioxane resin to the surface of an electronic device, followed by heating the hydrogen silsesquioxane resin to a temperature sufficient to convert it to a silica-containing ceramic. Second, a silicon carbide coating is applied to the surface of the silica-containing ceramic by a chemical vapor deposition (CVD) process. A third layer of porous silica-containing ceramic is formed on the surface of the second silicon carbide coating layer by applying a hydrogen silsesquioxane resin, and then heating the hydrogen silsesquioxane resin to a temperature sufficient to convert it to a porous silica-containing ceramic. The third layer of porous silica-containing ceramic is impregnated with a substance comprising an opaque material or a filler.

The fourth layer is a metal or metal alloy. It can also be a patterned layer of conducting metal lines deposited by photolithographic techniques. According to such techniques, photoresist patterns prevent etching of metal under the photoresist pattern, or the photoresist pattern limits the addition of the metal to only selected areas.

The fourth metal layer or pattern is coated with a fifth layer which is essentially the same as the third opaque porous silica-containing ceramic layer. It is preferred, however, that the composition of the fifth opaque porous silica-containing ceramic layer differ from the composition of the third opaque porous silica-containing ceramic layer.

Thus, the fifth opaque porous silica-containing ceramic layer should contain a different opaque material or filler than the opaque material or filler used in the third opaque porous silica-containing ceramic layer, and vice versa.

These and other features and objects of the invention will become apparent from a consideration of the detailed description.

DETAILED DESCRIPTION

Our invention is directed to the use of a series of ceramic and metallic coatings on electronic devices for hermetic protection and to prevent intrusion and inspection of the device. The coatings comprise (i) a silica-containing ceramic layer, (ii) an amorphous silicon carbide ceramic layer, (iii) a porous silica-containing ceramic layer with an opaque material or filler within its pores, (iv) a metal layer or metal pattern, and (v) another porous silica-containing ceramic layer with a different type of opaque material or filler within its pores.

The first silica-containing ceramic layer and the second silicon carbide coating layer planarize and hermetically seal the device. The third porous silica-containing ceramic layer with the opaque material or filler within its pores, inhibits inspection of the device. Moreover, etching though the third opaque porous silica-containing ceramic layer is very difficult due to its variation in density.

The fourth metal layer or pattern and the fifth opaque porous silica-containing ceramic layer function to enhance the degree of protection given the device against intrusion by destructive analysis techniques.

For purposes of our invention, the term "porous silicon-containing ceramic layer" is intended to mean a ceramic coating containing voids of a sufficient size to allow infiltration of an opaque material or filler, including voids such as pores, pinholes, or cracks. By "electronic device", "microelectronic device", and "electronic circuit", we intend to include but not limit ourselves to silicon-based semiconductor devices, gallium arsenide-based devices, focal plane arrays, opto-electronic devices, photovoltaic cells, and optical devices.

The First Layer

The first step in our process involves applying a hydrogen silsesquioxane resin to the surface of an electronic device, followed by heating the hydrogen silsesquioxane resin to a temperature sufficient to convert it to a silica-containing ceramic layer.

The hydrogen silsesquioxane resin is a hydridosiloxane resin having the formula $HSi(OH)_x(R)_yO_{z/2}$ or $HSi(OH)_x(OR)_yO_{z/2}$. R is independently an organic group or substituted organic group, which when bonded to silicon through the oxygen atom forms a hydrolyzable substituent. Examples of suitable R groups include alkyl groups such as methyl, ethyl, propyl, and butyl; aryl groups such as phenyl; and alkenyl groups such as allyl or vinyl. The value of x is 0–2; y is 0–2; z is 1–3; and the sum of x+y+z is 3.

These resins may be fully condensed $(HSiO_{3/2})_n$ or only partially hydrolyzed (i.e., containing some $\equiv$SiOR) and/or partially condensed (i.e., containing some $\equiv$SiOH). In addition, the resin may contain less than about 10% of silicon atoms having either 0 or 2 hydrogen atoms attached due to factors involved in their formation or handling.

Such resins are ladder or cage polymers which can be shown generally by the formula:

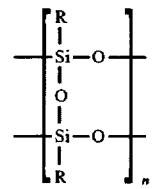

Typically, n has a value of four or more. By way of illustration, when n is four, a bond arrangement for the silsesquioxane cubical octamer is shown below:

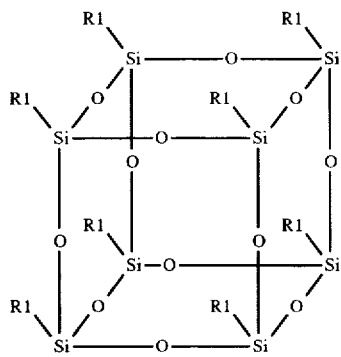

As the series is extended, i.e., where n is ten or more, double-stranded polysiloxanes of indefinitely higher molecular weight are formed, containing regular and repeated cross-ties in their extended structure.

Hydrogen silsesquioxane resins and methods for their preparation are described in U.S. Pat. No. 3,615,272 (Oct. 26, 1971) incorporated herein by reference. According to the method of the '272 patent, nearly fully condensed hydrogen silsesquioxane resin which may contain up to 100–300 parts per million silanol (≡SiOH), is prepared by a process comprising hydrolyzing trichlorosilane (HSiCl$_3$) in a benzenesulfonic acid hydrate hydrolysis medium, and washing the resultant resin with water or aqueous sulfuric acid. Similarly, U.S. Pat. No. 5,010,159 (Apr. 23, 1991) also incorporated by reference, teaches an alternative method comprising hydrolyzing hydridosilanes in an arylsulfonic acid hydrate hydrolysis medium to form a resin, which is then contacted with a neutralizing agent.

Hydridosiloxane resins described in U.S. Pat. No. 4,999,397 (Mar. 12, 1991); and resins produced by hydrolyzing an alkoxy or acyloxy silane in an acidic alcoholic hydrolysis medium described in Japanese Kokai Patents J59-178749 (Jul. 6, 1990), J60-86017 (May 15, 1985), and J63-107122 (May 12, 1988); are also suitable for purposes herein, and incorporated by reference.

The hydrogen silsesquioxane resin can be formed into the desired coating by any known technique. In a preferred method, however, a solution comprising a solvent and the hydrogen silsesquioxane resin is applied to the electronic device, and the solvent is evaporated. Such a solution can be formed, for example, by simply dissolving or dispersing the hydrogen silsesquioxane resin in a solvent or mixture of solvents. Suitable solvents are aromatic hydrocarbons such as benzene or toluene; alkanes such as n-heptane or dodecane; ketones; linear or cyclic polydimethylsiloxanes such as hexamethydisiloxane, octamethylcyclotetrasiloxane, and decamethylcyclopentasiloxane; esters; or ethers. Generally, enough solvent is used to form a 0.1–85 weight percent solution, preferably a 5–30 weight percent solution.

If desired, other materials may be added to the hydrogen silsesquioxane resin solution. These materials can include, for example, other preceramic materials; other preceramic polymer precursors; oxides such as aluminum, titanium, zirconium, tantalum, niobium, vanadium, boron, or phosphorous, at about 0.1–50 weight percent; catalysts such as platinum, rhodium, or copper, at 5–500 parts per million based on the weight of resin; or fillers. The purpose of a catalyst is to facilitate the conversion of the hydrogen silsesquioxane resin to the silica-containing ceramic.

The hydrogen silsesquioxane resin solution can be coated on the electronic device by spin coating, dip coating, spray coating, or flow coating; followed by evaporation of the solvent to form the preceramic coating. Although a solution approach is most desirable, melt coating can be used and is considered within the scope of our invention.

The hydrogen silsesquioxane resin is then converted to a silica-containing ceramic coating layer by heating it to a temperature sufficient for ceramification. Generally, the temperature is in the range of about 50° to about 800° C., preferably about 50° to about 600° C., more preferably 100°–450° C. The time for such heating should be sufficient to form the silica-containing ceramic layer, and is generally up to about 6 hours, with a range of between about 5 minutes to about 3 hours being preferred.

Heating may be conducted at any effective atmospheric pressure from vacuum to superatmospheric, and under any effective oxidizing or non-oxidizing gaseous environment, such as air, O$_2$, an inert gas such as N$_2$, ammonia, amines, moisture, N$_2$O, and hydrogen. Any method of heating can be employed, such as a convection oven, rapid thermal processor, hot plate, radiant energy, or microwave energy. While the rate of heating is not critical, it is most practical and preferred to heat as rapidly as possible.

The first layer can also be formed by heating the hydrogen silsesquioxane resin to a temperature above its melting point in an inert environment to allow the coating to melt and flow, but insufficient to allow the coating to ceramify. The melted coating is then heated in an environment which facilitates conversion to silica for a time sufficient to convert it to silica. This process is described in U.S. Pat. No. 5,145,723 (Sep. 8, 1992), assigned to the assignee of the present invention, and incorporated herein by reference.

The resultant first silica-containing ceramic layer smoothes and planarizes the surface of the electronic device and enables additional coatings to be applied with more facility. The first silica-containing ceramic layer may contain amorphous silica (SiO$_2$) and amorphous silica-like materials that are not fully free of residual carbon, silanol (≡SiOH) and/or hydrogen. The first silica-containing ceramic layer can be porous or condensed, depending on the temperature used for its ceramification.

The Second Layer

A silicon carbide coating layer is next applied to the surface of the first silica-containing ceramic layer. The method of applying the silicon carbide coating layer is not critical, and it can be applied by chemical vapor deposition techniques such as thermal chemical vapor deposition (CVD), photochemical vapor deposition, plasma enhanced chemical vapor deposition (PECVD), electron cyclotron resonance (ECR), and jet vapor deposition. In addition, it can be applied by physical vapor deposition techniques such as sputtering, or electron beam evaporation. These processes involve either the addition of energy in the form of heat or plasma to a vaporized species to cause the desired reaction, or focusing energy on a solid sample of the material to cause its deposition.

For example, in thermal chemical vapor deposition, the coating is deposited by passing a stream of desired precursor gas over a heated substrate. When the precursor gas contacts the hot surface, it reacts and deposits the coating. Substrate temperatures in the range of about 25°–1000° C. are sufficient to form these coatings in several minutes to several hours, depending on the precursor gas and the thickness of the coating. If desired, reactive metals can be used in the process to facilitate deposition.

In PECVD techniques, the precursor gas is reacted by passing it through a plasma field. Reactive species are formed and then focused at the substrate where they readily adhere. The advantage of the PECVD process over a thermal CVD process is that in the former, lower substrate and processing temperatures can be used, i.e., 25°–600° C.

Plasma used in PECVD processes can be energy derived from sources such as electric discharges, electromagnetic fields in the radio-frequency or microwave range, lasers, or particle beams. Preferred in most plasma deposition processes, however, is the use of radio frequency (i.e., 10 kHz to 102 MHz), or microwave energy (i.e., 0.1–10 GHz) at moderate power densities (i.e., 0.1–5 watts/cm$^2$). The specific frequency, power, and pressure, however, are tailored to the precursor gas and equipment being used.

Suitable precursor gases that can be used include (1) mixtures of silanes or halosilanes such as trichlorosilane (HSiCl$_3$) in the presence of an alkane of 1–6 carbon atoms, such as methane, ethane, and propane; (2) an alkylsilane such as methylsilane (CH$_3$SiH$_3$), dimethylsilane (CH$_3$)$_2$SiH$_2$, trimethylsilane (CH$_3$)$_3$SiH, and hexamethyldisilane (CH$_3$)$_3$Si—Si(CH$_3$)$_3$; or (3) a silacyclobutane or disilacyclobutane as described in U.S. Pat. No. 5,011,706 (Apr. 30, 1991) incorporated herein by reference.

Examples of silacyclobutanes (1) and disilacyclobutanes (2) are shown below wherein R1 is hydrogen, fluorine, or a hydrocarbon radical having 1–4 carbon atoms; and R2 is hydrogen or a hydrocarbon radical having 1–4 carbon atoms. One suitable disilacyclobutane is the 1,3-dimethyl-1,3-disilacyclobutane shown in formula (3).

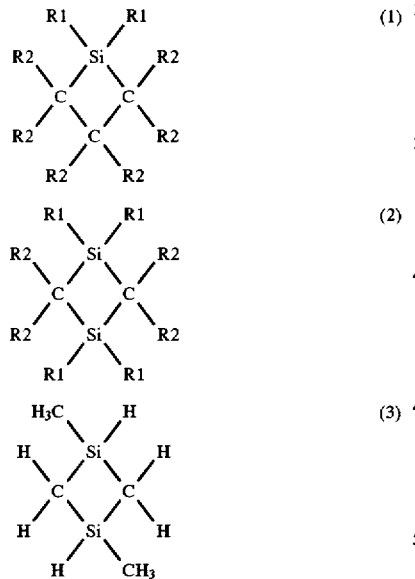

The technique preferred in our invention for forming the second layer is the plasma enhanced chemical vapor deposition of trimethylsilane. The resulting second silicon carbide coating layer forms a hermetic and electrical barrier over the surface of the first silica-containing ceramic layer on the electronic device, and inhibits damage from chemical and mechanical means. If desired, the second layer may constitute a layer of silicon nitride (Si$_x$N$_y$, i.e. Si$_3$N$_4$), silicon oxynitride (Si$_2$N$_2$O), or a layer of carbonized silicon nitride (SiNC).

The Third Layer

A porous silica-containing ceramic coating layer is next applied on the surface of the second silicon carbide coating layer. The third layer may be formed by selective deposition according to the technique described in U.S. Pat. No. 5,399,441 (Mar. 21, 1995), entitled "Method of Applying Opaque Coating", assigned to the same assignee as the present application. The third layer may also be formed in essentially the same manner as the first silica-containing ceramic layer. Thus, a hydrogen silsesquioxane resin is applied to the surface of the electronic device over the second layer, followed by heating the hydrogen silsesquioxane resin to a temperature sufficient to convert it to a silica-containing ceramic.

The heating process for forming the third layer, however, should be controlled to insure that the third layer remains porous. For example, it is known that at a temperature of about 600° C., a silica-containing ceramic is converted into relatively dense quartz when heated for a sufficient time. Therefore, heating of the third hydrogen silsesquioxane resin coating must be controlled so that the coating is not heated above 600° C. or, alternatively, if the coating is heated above 600° C., that the heating time be limited to less than 30 minutes. This insures that the resultant third layer is a silica-containing porous ceramic. Preferably, the third layer has a porosity of from one to about 25–30%. Such a ceramic layer provides the support for the opaque material or filler.

The third porous silica-containing ceramic layer is then either formulated with an opaque material or a filler, or infiltrated with an opaque material or a filler. For purposes herein, the term "opaque material" is meant to include (i) optically opaque materials which inhibit transmission of at least about 90% of visual light, and which are not transparent under visual inspection by the human eye under normal lighting; (ii) radiopaque materials which inhibit transmission of at least about 90% of a specific type of radiation, such as microwave, x-ray, ultraviolet (UV), infrared (IR), or sound waves; and (iii) mixtures of optically opaque and radiopaque materials.

Suitable examples of opaque materials include organic polymers such as polyimides, epoxies, and polybenzocyclobutanes; inorganic compounds such as phosphorous oxynitride (PON); dyes such as crystal violet (C$_{25}$H$_{30}$N$_3$Cl) and the cyanines; low melting point metals such as lead, tin, bismuth, and gallium; fluorocarbon polymers such as polytetrafluoroethylene (C$_2$F$_4$)$_n$, vinylidene fluoride H$_2$C=CF$_2$, and hexafluoropropylene CF$_3$CF:CF$_2$; and mixtures of such organic and inorganic substances.

Suitable examples of radiopaque materials are insoluble salts of heavy metals, since such salts render the resultant coating layer opaque to radiation such as microwave, x-ray, UV, IR, visible light, and sound waves. These include insoluble salts of barium, lead, silver, gold, cadmium, antimony, tin, palladium, strontium, tungsten, and bismuth. Such salts can include the carbonates, sulfates, and oxides, thereof.

The opaque materials are either formulated with the third porous silica-containing ceramic coating layer or infiltrated into the third porous silica-containing ceramic coating layer by known infiltration techniques. Thus, the third porous silica-containing ceramic layer may be melt infiltrated, vacuum infiltrated, high pressure infiltrated, infiltrated by a solution technique, or infiltrated by a supercritical fluid technique. After infiltration, excess material can be wiped away or allowed to remain on the surface to provide a thicker coating. The opaque material can be adhered in place by curing or heating, if desired.

In lieu of the opaque material, a filler such as described in commonly assigned U.S. Pat. No. 5,458,912 (Oct. 17, 1995) can be used. Such fillers can be incorporated into the third coating layer by any means. Suitable fillers include inorganic and organic materials in morphologies including but not limited to powders, particles, flakes, and microballoons. Some examples of inorganic fillers include synthetic and natural materials such as oxides, nitrides, borides, and carbides, of metals and non-metals such as glass, alumina, silica, titanium dioxide, zinc oxide, tungsten oxide, and ruthenium oxide; titanates such as potassium titanate $K_2TiO_3$ and barium titanate $BaTiO_3$; niobates such as lithium niobate $LiNbO_3$ and lead niobate $Pb(NbO_3)_2$; barium sulfate; calcium carbonate; precipitated diatomite; aluminum silicate and other silicates; pigments; diamond; phosphors; metals such as silver, aluminum, and copper; wollastonite $CaSiO_3$; mica; kaolin; clay; and talc. Organic materials such as cellulose; polyamides; and phenol resins, may also be used.

Preferred fillers, however, are those materials capable of reacting in an oxidizing environment to liberate sufficient heat to damage and/or destroy the underlying substrate. When such fillers are oxidized by plasma etching, wet etching, or cross-sectioning techniques, they liberate heat causing destruction of the underlying substrate. This serves to effectively inhibit any further intrusion or examination. Fillers of this type include metals such as magnesium, iron, silicon, tin, and zinc.

Other preferred fillers are, for example, plasma alumina microballons having an average particle diameter of about six microns, silica microballons having an average particle diameter of about 5–40 microns, silicon nitride powder, silicon carbide powder, aluminum nitride powder, and black pigment Ferro® F6331 having an average particle diameter of about 0.4 microns.

The particle size and shape of the filler can vary depending on its type and the desired coating thickness. The amount of filler can also vary depending on the quality and electrical characteristics desired in the third opaque porous silica-containing ceramic layer. Generally, however, the filler is used in amounts less than about 90 weight percent of the third opaque porous silica-containing ceramic layer to insure that enough of the porous resin is present to bind the filler. While smaller amounts of filler in the range of 1–5 weight percent can be used, the preferred amount of filler is in the range of about 5–80 weight percent of the third opaque porous silica-containing ceramic layer.

The Fourth Layer

The fourth coating is a metal layer derived from aluminum, gold, nickel, copper, silver, titanium, and tin; or from a suitable metal alloy such as titanium-tungsten, titanium nitride, and nickel-chromium. Aluminum is the preferred metal, however, because it is inexpensive, and is currently used commercially as the preferred circuit metallization in the vast majority of electronic devices. The fourth metal layer may be patterned to replicate an electronic circuit structure, if desired. The fourth metal layer is preferably applied over the third opaque porous silica-containing ceramic layer by sputtering or evaporation. According to this technique, the part to be coated, i.e., the electronic device, is placed in an evacuated chamber in close proximity to a flat plate of the coating material, i.e., the metal. The flat plate is the target and the target is bombarded by a beam of electrons. The electrons essentially knock atoms off the target and onto the surface of the part facing the target. Only the portion of the part directly exposed to the target gets coated. The advantages of the sputtering technique are that the purity of the coating can be controlled, and the part is not required to be heated during the coating process.

Techniques involving heat can also be employed, such as processes employing electron beam heating. Other alternate deposition techniques that can be used include physical vapor deposition (PVD), evaporation, electroless plating, or electrolytic plating of metals. In addition, and as noted above, the fourth metal layer can also be in the form of a pattern of metal deposited by a photolithography technique.

Where gold is selected as the metal for the fourth layer, it can be deposited by a method described in another commonly assigned copending U.S. application Ser. No. 08/494, 746, filed Jun. 26, 1995, entitled "Enhanced Adhesion of Hydrogen Silsesquioxane Resin Derived Silica to Gold". According to that method, silica derived from hydrogen silsesquioxane resin can be adhered to gold by low temperature annealing in an oxidizing atmosphere for about an hour or more.

The Fifth Layer

A fifth opaque porous silica-containing ceramic layer is applied over the fourth metal layer or pattern. The fifth opaque porous silica-containing ceramic layer is another coating layer similar to the third opaque porous silica-containing ceramic layer. While the fifth opaque porous silica-containing ceramic layer can be identical to the third opaque porous silica-containing ceramic layer, it is preferred that the fifth opaque porous silica-containing ceramic layer differ from the third opaque porous silica-containing ceramic layer, to provide an added degree of protection. Differences between the third and fifth layers can be achieved by utilizing different opaque materials or fillers in each of the layers. In other aspects, however, the third opaque porous silica-containing ceramic layer and the fifth opaque porous silica-containing ceramic layer are substantially the same.

If desired, (i) the first layer and the third layer can be reversed; (ii) the first layer and the fifth layer can be reversed; (iii) the first and second layers can be reversed with the third and fourth layers; (iv) the first layer plus the second layer can be reversed with the fifth layer; (v) the second layer can be applied after the fifth layer; (vi) the fourth layer can be deposited over the second layer; or (vii) the fourth layer can be deposited before the first layer.

It should therefore be apparent that electronic or microelectronic devices can be more effectively hermetically protected, and their inspection and intrusion inhibited, according to the concepts of our invention. Thus, the first silica-containing ceramic layer planarizes and insulates the electronic substrate. The second silicon carbide coating layer provides hermetic, electrical, and mechanical protection. The third opaque porous silica-containing ceramic layer impregnated with the opaque material or filler inhibits examination, and makes it difficult to etch the coating. The fourth metal layer or pattern provides added protection against destructive and non-destructive intrusion and analysis. The fifth opaque porous silica-containing ceramic layer impregnated with another type of opaque material or filler, provides further and additional protection against examination, and makes it increasingly difficult to etch the coating.

In instances where the surface of the electronic device to be coated includes bond pads used for interconnection, the coating layers of our invention may be applied in a manner so as not to coat the bond pads; or if the bond pads are coated, then after the coating layer(s) are applied, the coating layer(s) covering the bond pads can be etched or partially etched to allow for attachment of leads. Etching may be accomplished by dry etching with plasma, wet etching, or laser ablation.

Other variations may be made in compounds, compositions, articles of manufacture, and methods described without departing from the essential features of our invention. The forms of our invention are exemplary and not limitations on its scope as defined in the claims.

We claim:

1. A method of forming protective coatings on electronic devices comprising:
   A. applying a first composition comprising hydrogen silsesquioxane resin to the surface of an electronic device;
   B. heating the first composition to a temperature sufficient to convert the hydrogen silsesquioxane resin to a silica-containing ceramic;
   C. applying a silicon carbide coating to the surface of the silica-containing ceramic by chemical vapor deposition;
   D. applying a second composition comprising hydrogen silsesquioxane resin to the surface of the silicon carbide coating;
   E. heating the second composition to a temperature sufficient to convert the hydrogen silsesquioxane resin in the second composition to a porous silica-containing ceramic;
   F. impregnating the porous silica-containing ceramic with a substance comprising an opaque material or a filler;
   G. depositing a metal layer or metal pattern on the impregnated porous silica-containing ceramic of step F; and
   H. applying a second impregnated porous silica-containing ceramic to the metal of step G by repeating steps D–F.

2. The method of claim 1 wherein the first composition comprising hydrogen silsequinoxane resin of step A contains a solvent, and the hydrogen silsesquioxane is diluted to between 5–30 weight percent solids.

3. The method of claim 1 wherein the second composition comprising hydrogen silsesquioxane resin of step D contains a solvent, and the hydrogen silsesquioxane is diluted to between 5–30 weight percent solids.

4. The method of claim 1 wherein the first composition comprising hydrogen silsesquioxane resin of step A contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors, and phosphorous oxide precursors.

5. The method of claim 1 wherein the second composition comprising hydrogen silsesquioxane resin of step D contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors, and phosphorous oxide precursors.

6. The method of claim 1 wherein the first composition comprising hydrogen silsesquioxane resin of step A contains a catalyst to facilitate the conversion of the hydrogen silsesquioxane resin to the silica-containing ceramic.

7. The method of claim 1 wherein the second composition comprising hydrogen silsesquioxane resin of step D contains a catalyst to facilitate the conversion of the hydrogen silsesquioxane resin to the silica-containing ceramic.

8. The method of claim 1 wherein the heating of step B is conducted at a temperature in the range of 50°–800° C. for 1–6 hours.

9. The method of claim 1 wherein the heating of step E is conducted at a temperature in the range of 50°–600° C. for 1–6 hours.

10. The method of claim 1 wherein the silicon carbide of step C is applied by introducing a source gas into a process selected from the group consisting of thermal chemical vapor deposition, photochemical vapor deposition, plasma enhanced chemical vapor deposition, electron cyclotron resonance, and jet vapor deposition.

11. The method of claim 10 wherein the source gas is selected from the group consisting of a mixture of a silane and an alkane of 1–6 carbon atoms, an alkylsilane, a silacyclobutane, and a disilacyclobutane.

12. The method of claim 10 wherein the silicon carbide is deposited by the chemical vapor deposition of trimethylsilane.

13. The method of claim 1 wherein the silicon carbide coating is replaced in whole or in part with a coating of silicon nitride, silicon oxynitride, or carbonized silicon nitride.

14. The method of claim 1 wherein the opaque material is selected from the group consisting of optically opaque materials, radiopaque materials, and mixtures thereof.

15. The method of claim 1 wherein the opaque material is selected from the group consisting of organic polymers, inorganic polymers, dyes, fluorocarbon polymers, and mixtures thereof.

16. The method of claim 1 in which the filler is one which reacts in an oxidizing atmosphere to liberate enough heat to damage the electronic device.

17. The method of claim 1 in which the opaque material or filler in step H is not the same as the opaque material or filler in step F.

18. The method of claim 1 in which steps A–B and steps D–F are reversed.

19. The method of claim 1 in which steps A–B and step H are reversed.

20. The method of claim 1 in which steps A–C and steps D–F are reversed.

21. The method of claim 1 in which steps A–C and step H are reversed.

22. The method of claim 1 in which step C follows step H or in which step G preceeds step A or follows step C.

23. An electronic device formed by the process of claim 1.

24. An article of manufacture comprising:
   an electronic device;
   a silica-containing ceramic coating on the surface of the electronic device;
   a silicon carbide ceramic coating on the surface of the silica-containing ceramic coating;
   a first porous silica-containing ceramic coating on the surface of the silicon carbide ceramic coating, wherein a substance comprising an opaque material or a filler is within the pores of the porous silica-containing ceramic coating;
   a metal layer or metal pattern on the surface of the opaque porous silica-containing ceramic coating; and
   a second porous silica-containing ceramic coating on the surface of the metal, wherein a substance comprising an opaque material or filler is within the pores of the second porous silica-containing ceramic coating.

25. The article of claim 24 wherein the opaque material is selected from the group consisting of optically opaque materials, radiopaque materials, and mixtures thereof.

26. The article of claim 24 wherein the opaque material is selected from the group consisting of organic polymers, inorganic polymers, dyes, fluorocarbon polymers, and mixtures thereof.

27. The article of claim 24 in which the filler is one which reacts in an oxidizing atmosphere to liberate enough heat to damage the electronic device.

28. The article of claim 24 in which the opaque material or filler in the first porous silica-containing ceramic coating is not the same as the opaque material or filler in the second porous silica-containing ceramic coating.

29. The article of claim 24 in which the silica-containing ceramic coating on the surface of the electronic device, and the first porous silica-containing ceramic coating comprising an opaque material or filler within its pores, are reversed.

30. The article of claim 24 in which the silica-containing ceramic coating on the surface of the electronic device, and the second porous silica-containing ceramic coating comprising an opaque material or filler within its pores, are reversed.

31. The article of claim 24 in which the metal layer is selected from the group consisting of aluminum, gold, nickel, copper, silver, titanium, tin, titanium-tungsten, titanium nitride, and nickel-chromium.

32. The article of claim 24 wherein the silicon carbide ceramic coating is replaced in whole or in part with a coating of silicon nitride, silicon oxynitride, or carbonized silicon nitride.

33. The article of claim 24 wherein the metal layer or metal pattern is deposited over the silicon carbide ceramic coating or is deposited before the silica-containing ceramic coating.

34. A method of forming protective coatings on electronic devices comprising:

A. applying a first composition comprising hydrogen silsesquioxane resin to the surface of an electronic device;

B. heating the first composition to a temperature sufficient to convert the hydrogen silsesquioxane resin to a silica-containing ceramic;

C. applying a silicon carbide coating to the surface of the silica-containing ceramic by chemical vapor deposition;

D. applying a second composition comprising hydrogen silsesquioxane resin and an opaque filler to the surface of the silicon carbide coating;

E. heating the second composition to a temperature sufficient to convert the hydrogen silsesquioxane resin in the second composition to an opaque porous silica-containing ceramic;

F. depositing a metal layer or metal pattern on the impregnated porous silica-containing ceramic of step F; and G. applying a second opaque porous silica-containing ceramic to the metal of step G.

* * * * *